(12) United States Patent
Nomura

(10) Patent No.: US 10,892,711 B2
(45) Date of Patent: Jan. 12, 2021

(54) OSCILLATOR, ELECTRONIC APPARATUS, AND VEHICLE

(71) Applicant: SEIKO EPSON CORPORATION, Tokyo (JP)

(72) Inventor: Norio Nomura, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/745,803

(22) Filed: Jan. 17, 2020

(65) Prior Publication Data

US 2020/0235701 A1    Jul. 23, 2020

(30) Foreign Application Priority Data

Jan. 18, 2019  (JP) ................. 2019-007214

(51) Int. Cl.

| | | |
|---|---|---|
| G01N 27/00 | (2006.01) | |
| G08B 19/00 | (2006.01) | |
| G08B 21/00 | (2006.01) | |
| H03B 5/32 | (2006.01) | |
| H03B 5/04 | (2006.01) | |
| H03L 7/099 | (2006.01) | |
| H03L 7/087 | (2006.01) | |

(52) U.S. Cl.
CPC ............ *H03B 5/32* (2013.01); *H03B 5/04* (2013.01); *H03B 2200/0018* (2013.01); *H03B 2200/0088* (2013.01); *H03L 7/087* (2013.01); *H03L 7/0992* (2013.01)

(58) Field of Classification Search
CPC .... H03B 5/32; H03B 5/04; H03B 2200/0088; H03B 2200/0018; H03L 7/087; H03L 7/0992
USPC .......................................... 331/66
See application file for complete search history.

(56) References Cited

U.S. PATENT DOCUMENTS

| | | | |
|---|---|---|---|
| 6,777,613 B2 * | 8/2004 | Okazaki ............ | H03H 9/0509 174/539 |
| 9,853,628 B1 * | 12/2017 | Chen ............... | H03H 9/19 |
| 2017/0019111 A1 | 1/2017 | Yorita | |
| 2017/0359075 A1 * | 12/2017 | Kikuchi .......... | H03H 9/1021 |
| 2018/0167072 A1 | 6/2018 | Yorita | |

FOREIGN PATENT DOCUMENTS

| | | |
|---|---|---|
| JP | H11-112340A A | 4/1999 |
| JP | 2015-201840 A | 11/2015 |
| JP | 2016-225739 A | 12/2016 |

* cited by examiner

*Primary Examiner* — Richard Tan
(74) *Attorney, Agent, or Firm* — Oliff PLC

(57) ABSTRACT

An oscillator includes a first resonator element, a first circuit element configured to oscillate the first resonator element to generate a first oscillation signal, a first package which is configured to house the first resonator element and the first circuit element, and has a mounting surface and a mounting terminal disposed on the mounting surface, a second resonator element an oscillation frequency of which is controlled based on the first oscillation signal, and a second package which houses the second resonator element and is provided with the second package mounted on the mounting surface of the first package.

9 Claims, 14 Drawing Sheets

OSCILLATOR, ELECTRONIC APPARATUS, AND VEHICLE

The present application is based on, and claims priority from JP Application Serial Number 2019-007214, filed Jan. 18, 2019, the disclosure of which is hereby incorporated by reference herein in its entirety.

BACKGROUND

1. Technical Field

The present disclosure relates to an oscillator, an electronic apparatus, and a vehicle.

2. Related Art

In, for example, JP-A-2016-225739 (Document 1), there is disclosed an oscillator device including a first quartz crystal resonator and a second quartz crystal resonator, a first oscillation circuit and a second oscillation circuit for oscillating these quartz crystal resonators, and a PLL (Phase Locked Loop) circuit section disposed on an posterior side of the first and second oscillation circuits. In such an oscillator device, a frequency signal output from the first oscillation circuit is used as a reference frequency signal. Further, the frequency control is performed so that the frequency of the frequency signal output from a VCXO (Voltage Controlled X'tal Oscillator) disposed inside a PLL circuit section approximates the frequency of the reference frequency signal.

In the oscillator device described in Document 1, the first quartz crystal resonator for generating the reference frequency signal and the VCXO disposed in the PLL circuit section are disposed on the same substrate, and are electrically coupled to each other. For this coupling, there are used interconnections laid on the substrate, but there arises a problem that the stray capacitance in the interconnections is high. When the stray capacitance in the interconnections is high, it becomes easy for noises to be superimposed on the frequency signal in an area between the first quartz crystal resonator and the VCXO. Therefore, there is a problem that the frequency of the signal output from the oscillator device becomes unstable.

SUMMARY

An oscillator according to an application example of the present disclosure includes a first resonator element, a first circuit element configured to oscillate the first resonator element to generate a first oscillation signal, a first package which is configured to house the first resonator element and the first circuit element, and has a mounting surface and a mounting terminal disposed on the mounting surface, a second resonator element an oscillation frequency of which is controlled based on the first oscillation signal, and a second package which houses the second resonator element and is provided with the second package mounted on the mounting surface of the first package.

DESCRIPTION OF EXEMPLARY EMBODIMENTS

Hereinafter, preferred embodiments of an oscillator, an electronic apparatus, and a vehicle according to the present disclosure will be described in detail based on the accompanying drawings.

Oscillator

Firstly, the oscillator according to the embodiment will be described.

Figure 1:
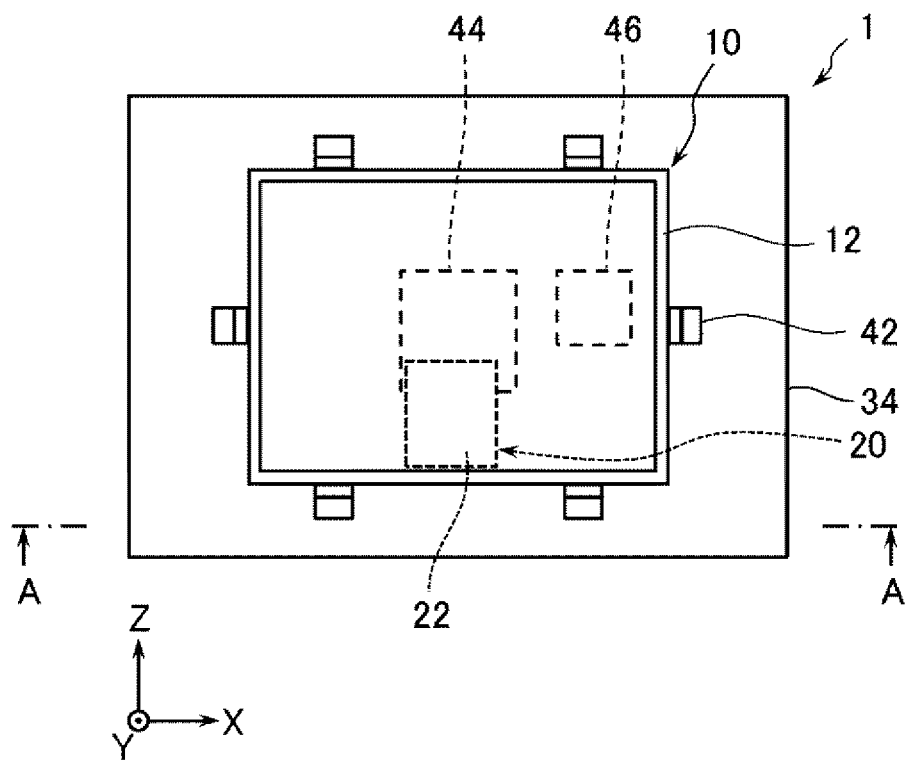
FIG. 1 is a plan view showing a structure of an oscillator according to an embodiment.
Figure 2:
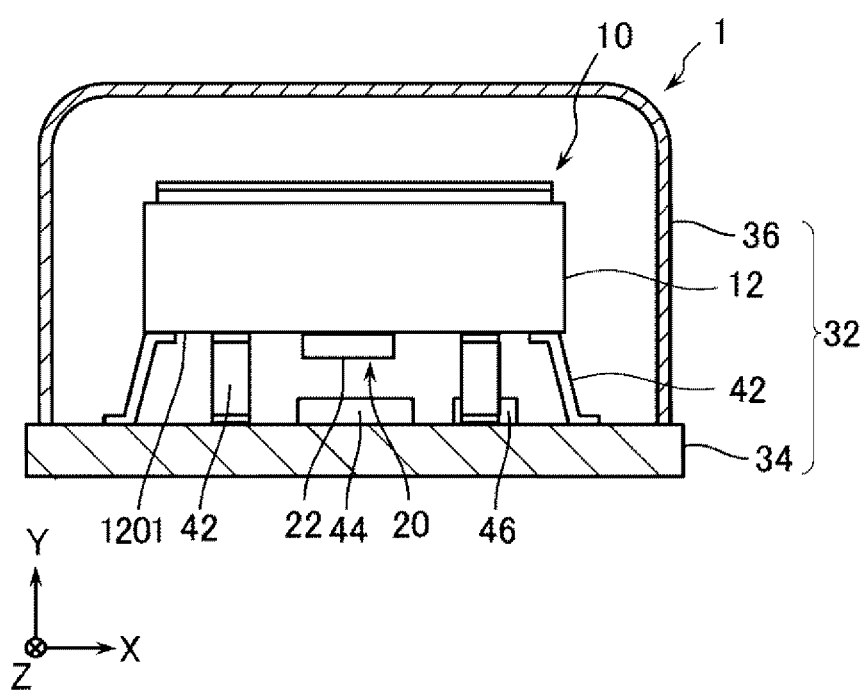
FIG. 2 is a cross-sectional view along the line A-A in FIG. 1.
Figure 3:
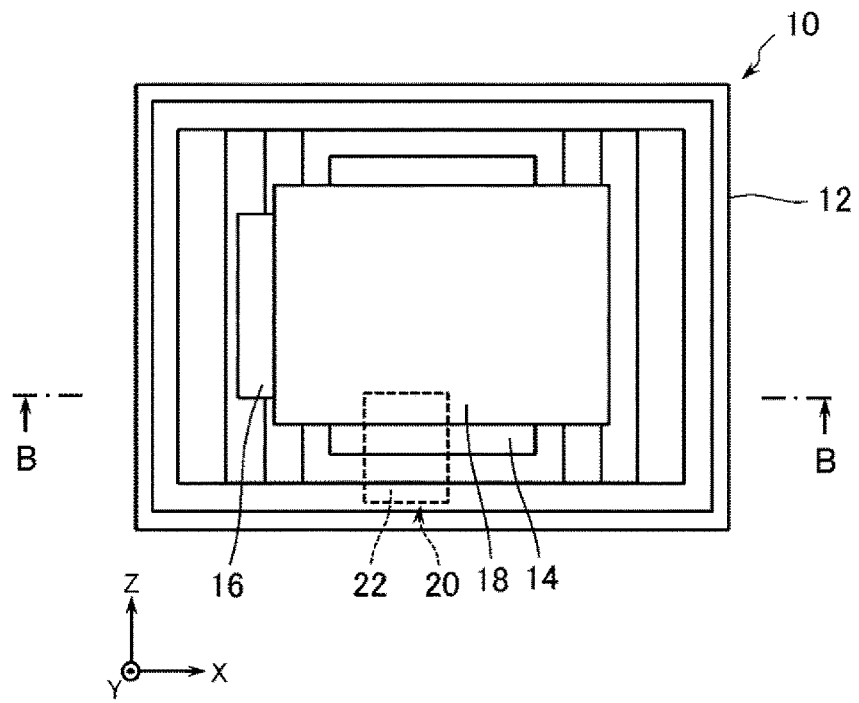
FIG. 3 is a plan view showing a schematic configuration of a first package included in the oscillator shown in FIG. 1.
Figure 4:
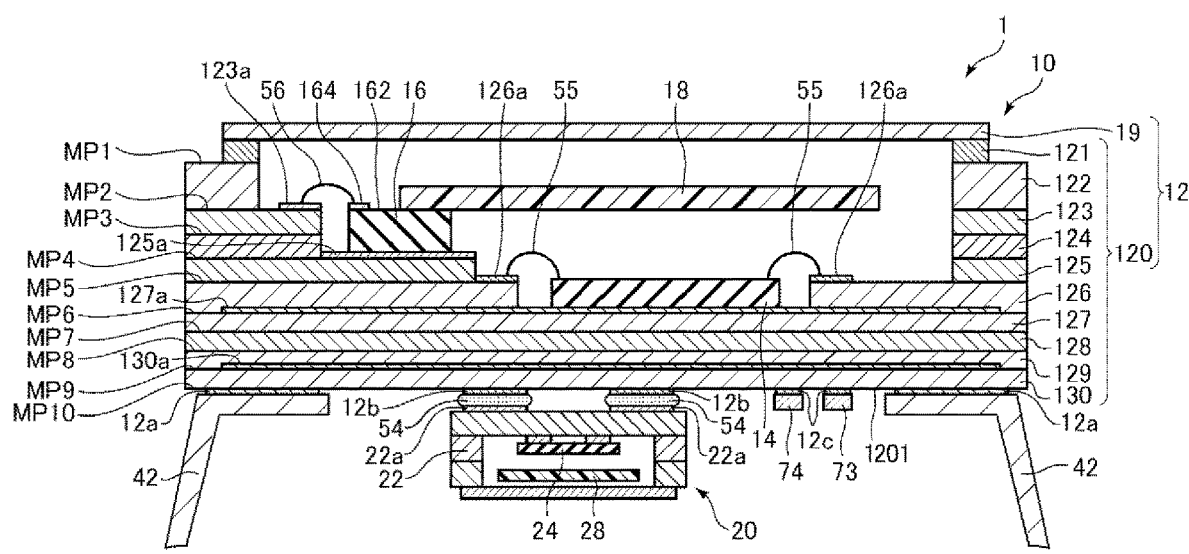
FIG. 4 is a cross-sectional view along the line B-B in FIG. 3.

FIG. 1 is a plan view showing a structure of the oscillator according to the embodiment. FIG. 2 is a cross-sectional view along the line A-A in FIG. 1. FIG. 3 is a plan view showing a schematic configuration of a first package included in the oscillator shown in FIG. 1. FIG. 4 is a cross-sectional view along the line B-B in FIG. 3. It should be noted that FIG. 1 shows the state in which a cover is removed, and FIG. 3 shows the state in which a lid member is removed. Further, an X axis, a Y axis, and a Z axis are shown as three axes perpendicular to each other for the sake of convenience of explanation in the drawings including the drawings described later. Further, for the sake of convenience of explanation, in the following description, a surface on the +Y-axis direction side is defined as an upper surface, and a surface on the −Y-axis direction side is defined as a lower surface in the plan view viewed from the Y-axis direction. It should be noted that the plan view in the present specification denotes a plan view viewed from the Y-axis direction. Further, some of wiring patterns and electrode pads formed on the upper surface of a base substrate, connection terminals formed on an outside surface of each of the packages, and wiring patterns and electrode pads formed inside of the packages are omitted from the drawings.

As shown in FIG. 1 and FIG. 2, the oscillator 1 is provided with a first oscillation section 10 as an OCXO (Oven Controlled X'tal Oscillator) provided with a first container 12 (a first package), and a second oscillation section 20 as a VCXO provided with a second container 22 (a second package).

Further, the oscillator 1 is provided with a third container 32. The first oscillation section 10 and the second oscillation section 20 are housed in the third container 32. As shown in FIG. 2, the third container 32 is provided with a base substrate 34 and a cover 36.

On the upper surface of the base substrate 34, there are disposed the first oscillation section 10 and the second oscillation section 20 via a lead frame 42. Thus, the first oscillation section 10 and the second oscillation section 20 are disposed so as to mechanically be isolated from the base substrate 34. Further, on the upper surface of the base substrate 34, there are additionally disposed a circuit element 44, circuit components 46 such as a plurality of capacitors and resistors, and so on as needed.

Further, as shown in FIG. 3 and FIG. 4, the first oscillation section 10 has the first container 12, a first oscillation circuit 141 as apart of a circuit in an integrated circuit 14 (a first circuit element) housed in the first container 12, and a temperature control element 16 and a quartz crystal resonator element 18 (a first resonator element) housed in the first container 12.

Further, as shown in FIG. 4, the second oscillation section 20 is disposed on the lower surface of the first container 12, and has the second container 22, an integrated circuit 24 (a second circuit element) housed in the second container 22, and a quartz crystal resonator element 28 (a second resonator element) housed in the second container 22.

As described above, the first oscillation section 10 has the first container 12, the temperature control element 16, and the quartz crystal resonator element 18.

Among these constituents, the first container 12 has a container main body 120 and a lid member 19 (a first lid body). As shown in FIG. 4, the container main body 120 is constituted by a fist layer 121, a second layer 122, a third layer 123, a fourth layer 124, a fifth layer 125, a sixth layer 126, a seventh layer 127, an eighth layer 128, a ninth layer 129, and a tenth layer 130 stacked on one another in this order from above. Each of the first layer 121 through the sixth layer is removed in a central part to have a ring-like shape. A cavity for housing the temperature control element 16 and the quartz crystal resonator element 18 is constituted by the second layer 122 through the fourth layer 124, and a cavity for housing the integrated circuit 14 is constituted by the fifth layer 125 and the sixth layer 126.

The first layer 121 is formed of a seal member such as a seal ring or a low-melting-point glass layer.

The second layer 122 is formed of, for example, a metalization layer, a plated layer, or a brazing filler metal layer.

Each of the third layer 123 through the tenth layer 130 is formed of an insulating material such as a ceramic material or a glass material.

The inside of such a first container 12 is airtightly sealed in a reduced pressure atmosphere such as vacuum, or an inert gas atmosphere with nitrogen, argon, helium, or the like.

It should be noted that the number of layers in the container main body 120 is not particularly limited, and can be larger or can also be smaller than as described above.

Further, a lower surface of the first container 12 corresponds to a mounting surface 1201 of the first oscillation section 10. On the mounting surface 1201, there are disposed mounting terminals 12a. The mounting terminals 12a are electrically coupled to the base substrate 34 via the lead frame 42.

The integrated circuit 14 is disposed on an upper surface of the seventh layer 127, and is bonded via a bonding member not shown. The integrated circuit 14 is electrically coupled to electrode pads 126a disposed on an upper surface of the sixth layer 126 via, for example, bonding wires 55.

The temperature control element 16 is disposed on an upper surface of the fifth layer 125, and is bonded via a bonding member not shown. The temperature control element 16 is an element including a resistance heating element, a thermosensor, and so on. On an active surface 162 as an upper surface of the temperature control element 16, there are disposed electrode pads 164. The electrode pads 164 are electrically coupled to electrode pads 123a disposed on an upper surface of the third layer 123 via, for example, bonding wires 56.

The quartz crystal resonator element 18 is disposed on the active surface 162 of the temperature control element 16. As the quartz crystal resonator element 18, there is preferably used, for example, an SC-cut quartz crystal resonator element superior in frequency stability.

It should be noted that the quartz crystal resonator element 18 is not limited to the SC-cut quartz crystal resonator element forming a rectangular shape as shown in FIG. 3, but can be an SC-cut quartz crystal resonator element forming a circular shape, or can also be other piezoelectric resonator elements such as an AT-cut quartz crystal resonator element forming a rectangular shape or a circular shape, a tuning-fork quartz crystal resonator element, or a surface acoustic wave resonator element, an MEMS (Micro Electro Mechanical Systems) resonator element, or the like.

In the quartz crystal resonator element 18, electrode pads not shown disposed on a lower surface thereof and electrode pads not shown disposed on the active surface 162 are electrically coupled to each other via bonding members such as metal bumps or an electrically-conductive adhesive. Further, excitation electrodes not shown disposed upper and lower surfaces of the quartz crystal resonator element 18 and the electrode pads disposed on the lower surface of the quartz crystal resonator element 18 are also electrically coupled to each other.

As described above, in the present embodiment, since the temperature control element 16 and the quartz crystal resonator element 18 are housed in the same container, namely the first container 12, the temperature difference between the constituents becomes small, and it is possible to obtain the oscillator 1 superior in frequency-temperature characteristic.

It should be noted that since it is sufficient for the temperature control element 16 and the quartz crystal resonator element 18 to be coupled to each other so that the heat generated in the temperature control element 16 is transferred to the quartz crystal resonator element 18, it is also possible for the temperature control section 16 and the quartz crystal resonator element 18, or the container main body 120 and the quartz crystal resonator element 18 to be electrically coupled to each other using electrically conductive members such as bonding wires while, for example, the temperature control element 16 and the quartz crystal resonator element 18 are coupled to each other via a bonding member having an insulating property.

The second oscillation section 20 is a voltage-controlled quartz crystal oscillator, namely a VCXO, disposed on the mounting surface 1201 as a lower surface of the tenth layer 130 of the first container 12. As described above, such a second oscillation section 20 has the second container 22, the integrated circuit 24, and the quartz crystal resonator element 28.

Inside the second container 22, there is formed a cavity, and there are housed the integrated circuit 24 and the quartz crystal resonator element 28. As the quartz crystal resonator element 28, there is preferably used, for example, an AT-cut quartz crystal resonator element forming a rectangular shape.

The inside of such a second container 22 is airtightly sealed in a reduced pressure atmosphere such as vacuum, or an inert gas atmosphere with nitrogen, argon, helium, or the like.

Further, on the upper surface of the second container 22, there are disposed mounting terminals 22a. Further, on the mounting surface 1201 of the first container 12 described above, there are disposed connection terminals 12b. The mounting terminals 22a and the connection terminals 12b are bonded to each other via bonding members 54, respectively.

As shown in FIG. 2, the first oscillation section 10 and the second oscillation section 20 described above are housed in the third container 32.

As the constituent material of the cover 36 and the lead frame 42 of the third container 32, there is preferably used a material obtained by applying nickel plating to an iron-based alloy low in thermal conductivity such as a nickel-iron alloy like 42-alloy.

Further, as the constituent material of the base substrate 34 of the third container 32, there can be cited, for example, glass epoxy resin or ceramics having an insulating property. Further, the interconnections provided to the base substrate 34 can be formed using, for example, a method of etching a copper foil applied to the entire surface of a substrate, a method of screen-printing a metal wiring material such as tungsten or molybdenum on a substrate and then calcining the metal wiring material and then applying plating with nickel, gold, or the like on the metal wiring material thus calcined, and so on.

It should be noted that the inside of the third container 32 is airtightly sealed in a reduced pressure atmosphere such as vacuum, or an inert gas atmosphere with nitrogen, argon, helium, or the like.

Further, the oscillator 1 is provided with a bypass capacitor 73 (a first bypass capacitor) and a bypass capacitor 74 (a second bypass capacitor) disposed on the mounting surface 1201. Further, on the mounting surface 1201 of the first container 12 described above, there are disposed connection terminals 12c. The bypass capacitors 73, 74 and the connection terminals 12c are respectively bonded to each other via bonding members not shown.

Then, a circuit configuration of the oscillator according to the embodiment will be described.

Figure 5:
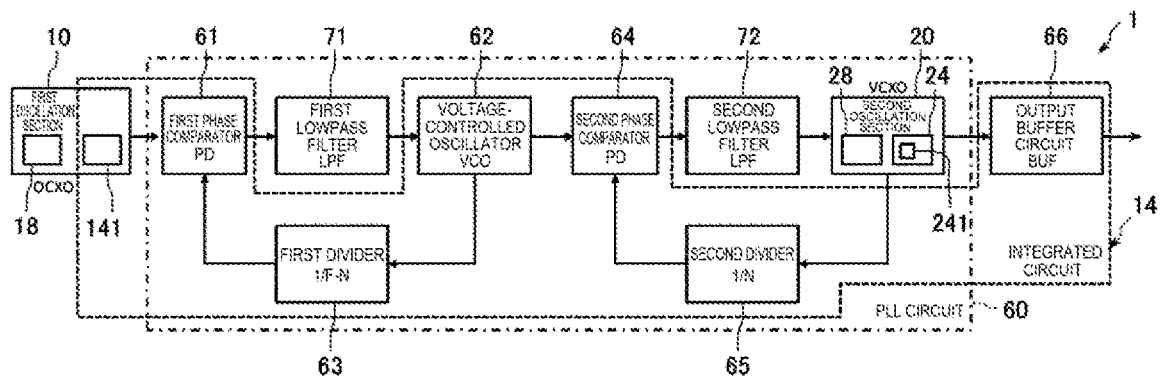
FIG. 5 is a block diagram showing a circuit configuration of the oscillator according to the embodiment.

FIG. 5 is a block diagram showing the circuit configuration of the oscillator according to the embodiment.

The oscillator 1 shown in FIG. 5 is provided with the first oscillation section 10, a PLL circuit 60 including the second oscillation section 20, and an output buffer circuit 66. The PLL in the PLL circuit 60 denotes a phase locked loop.

Among these constituents, the first oscillation section 10 has the first oscillation circuit 141 for oscillating the quartz crystal resonator element 18, but in the present embodiment, the first oscillation circuit 141 is disposed inside the integrated circuit 14.

On the other hand, although the second oscillation section 20 is provided with the integrated circuit 24 as described above, the integrated circuit 24 includes the second oscillation circuit 241 for oscillating the quartz crystal resonator element 28.

Further, in the oscillator 1 according to the present embodiment, a part of the PLL circuit 60 and the output buffer circuit 66 are also installed in the integrated circuit 14 in a mixed manner.

The PLL circuit 60 has a first phase comparator 61 to which the reference frequency signal (a first oscillation signal) output from the first oscillation section 10 as the OCXO is input, a voltage-controlled oscillator 62 to which a direct-current signal from a first lowpass filter 71 is input, and a first divider 63 to which a frequency signal output by the voltage-controlled oscillator 62 is input. Then, the frequency signal divided in frequency by the first divider 63 is input to the first phase comparator 61. In the first phase comparator 61, a phase difference between the reference frequency signal and the frequency signal is detected, and is then output to the first lowpass filter 71. In the first lowpass filter 71, a high frequency component is removed from the output signal from the first phase comparator 61, then the result is converted into a voltage and is output as a direct-current signal for controlling the voltage-controlled oscillator 62.

Among these constituents, the first phase comparator 61, the voltage-controlled oscillator 62, and the first divider 63 are disposed in the integrated circuit 14. In contrast, the first lowpass filter 71 is disposed on, for example, the mounting surface 1201 although not shown in the drawings.

It should be noted that the first divider 63 can set a fractional frequency division ratio by, for example, switching between integer frequency division ratios to achieve the fractional frequency division ratio on average. Thus, the anterior part of the PLL circuit constituted by the first phase comparator 61, the first lowpass filter 71, the voltage-controlled oscillator 62, and the first divider 63 functions as a fractional frequency dividing PLL circuit (a fractional PLL circuit). As a result, in the fractional frequency dividing PLL circuit, it becomes possible to output a signal with an arbitrary frequency.

Further, the PLL circuit 60 has a second phase comparator 64 to which a frequency signal output from the voltage-controlled oscillator 62 is input, a second lowpass filter 72, the second oscillation section 20, and a second divider 65 to which a frequency signal (a second oscillation signal) output from the second oscillation section 20 as the VCXO is input. Then, the frequency signal divided in frequency by the second divider 65 is input to the second phase comparator 64. In the second phase comparator 64, a phase difference between the frequency signal and the frequency signal is detected, and is then output to the second lowpass filter 72. In the second lowpass filter 72, a high frequency component is removed from the output signal from the second phase comparator 64, then the result is converted into a voltage, and is output as a direct-current signal (a frequency control signal) for controlling the second oscillation section 20.

Among these constituents, the second phase comparator 64 and the second divider 65 are disposed in the integrated circuit 14. In contrast, the second lowpass filter 72 is disposed on, for example, the mounting surface 1201 although not shown in the drawings.

It should be noted that the second divider 65 is, for example, an integer divider for performing the integer frequency division on the signal input to the second divider 65. Thus, a PLL circuit part in a posterior stage constituted by the second phase comparator 64, the second lowpass filter 72, the second oscillation section 20, and the second divider 65 functions as an integer frequency dividing PLL circuit (an integer PLL circuit). As a result, in the integer frequency dividing PLL circuit, it is possible to form a circuit relatively low in phase noise, and having a relatively simple circuit configuration.

Then, a frequency signal corresponding to the voltage of the direct-current signal is output from the second oscillation section 20 toward the output buffer circuit 66.

It should be noted that the circuit configuration described above is illustrative only, and the configuration described above is not a limitation.

Further, some of the elements included in the integrated circuit 14 described above can be disposed outside the integrated circuit 14. For example, some of the elements of the first oscillation circuit 141 can be located outside the integrated circuit 14. Similarly, it is also possible for the output buffer circuit 66 to be located outside the integrated circuit 14.

On the contrary, an element not included in the integrated circuit 14 described above can be disposed in the integrated circuit 14. For example, it is also possible for some or all of the elements of the integrated circuit 24 disposed in the second oscillation section 20 to be installed in the integrated circuit 14 in a mixed manner.

On the other hand, some of the elements of the second oscillation circuit 241 can be located outside the integrated circuit 24.

In the oscillator 1 having such a circuit configuration as described above, in particular, the interconnections through which the frequency signals pass can be a noise source. In the interconnections adjacent to each other, when a noise which derives from the frequency signal of one of the interconnections is superimposed on the other of the interconnections, the frequency fluctuates, and finally, the accuracy of the frequency signal output from the output buffer circuit 66 is degraded as a result.

Therefore, in the present embodiment, as described above, the second container 22 of the second oscillation section 20 is mounted on the lower surface of the first container 12 of the first oscillation section 10. Specifically, the oscillator 1 according to the present embodiment is provided with the quartz crystal resonator element 18 (the first resonator element), the first oscillation circuit 141 (the first circuit element) for oscillating the quartz crystal resonator element 18 to generate the reference frequency signal (the first oscillation signal), the first container 12 (the first package) for housing the quartz crystal resonator element 18 and the first oscillation circuit 141, and has the mounting surface 1201 and the mounting terminals 12a disposed on the mounting surface 1201, the quartz crystal resonator element 28 (the second resonator element) the oscillation frequency of which is controlled based on the reference frequency signal, and the second container 22 (the second package) which houses the quartz crystal resonator element 28, and is mounted on the mounting surface 1201 of the first container 12.

Thus, as a result, the integrated circuit 14 in the first container 12 is disposed closely to the second oscillation section 20 via the seventh layer 127 through the tenth layer 130. Therefore, it is possible to reduce the physical distance between the PLL circuit 60 and the second oscillation section 20 compared to when, for example, disposing the first oscillation section 10 and the second oscillation section 20 on the substrate separately from each other. Thus, the length of the interconnections can be shortened, and therefore, the stray capacitance of the interconnections is reduced, and thus, it becomes difficult for the noise to be superimposed. In such a manner as described above, it is possible to realize the oscillator 1 with the frequency fluctuation suppressed, and therefore high in accuracy.

Further, since it is possible to make the first container 12 and the second container 22 closer to each other, it is possible to reduce the size after assembly. Thus, reduction in size of the oscillator 1 can be achieved.

Here, the lower surface of the tenth layer 130 is defined as a □tenth surface MP10.□ Further, the upper surface of the tenth layer 130 is defined as a □ninth surface MP9,□ the upper surface of the ninth layer 129 is defined as an □eighth surface MP8,□ the upper surface of the eighth layer 128 is defined as a □seventh surface MP7,□ the upper surface of the seventh layer 127 is defined as a □sixth surface MP6,□ the upper surface of the sixth layer 126 is defined as a □fifth surface MP5,□ the upper surface of the fifth layer 125 is defined as a □fourth surface MP4,□ the upper surface of the fourth layer 124 is defined as a □third surface MP3,□ the upper surface of the third layer 123 is defined as a □second surface MP2,□ and the upper surface of the second layer 122 is defined as a □first surface MP1.□

Figure 13:
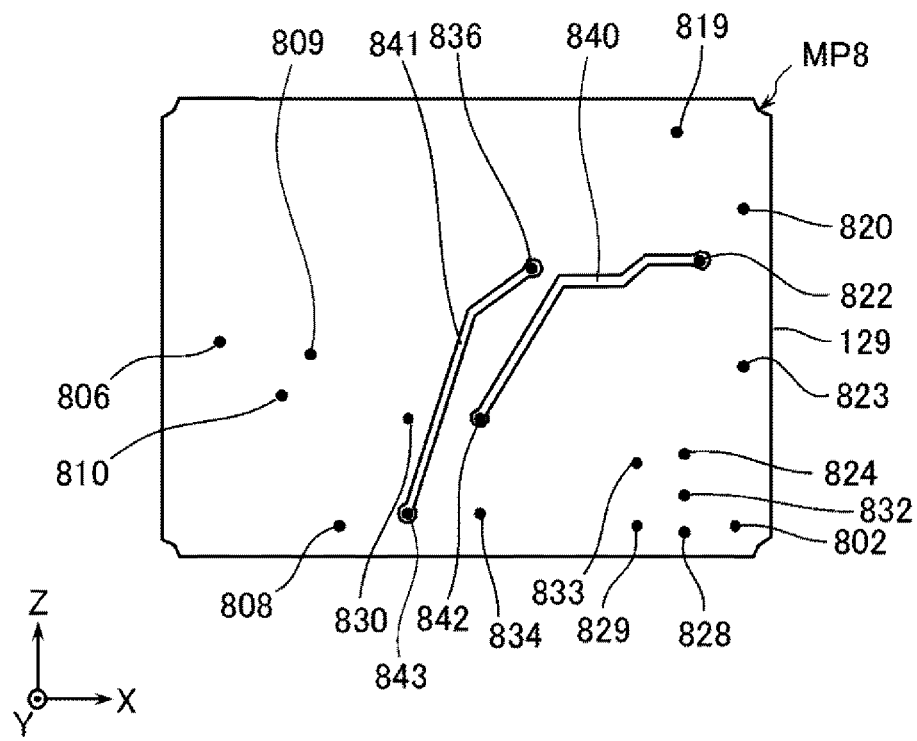
FIG. 13 is a plan view showing an eighth surface of the first container.
Figure 14:
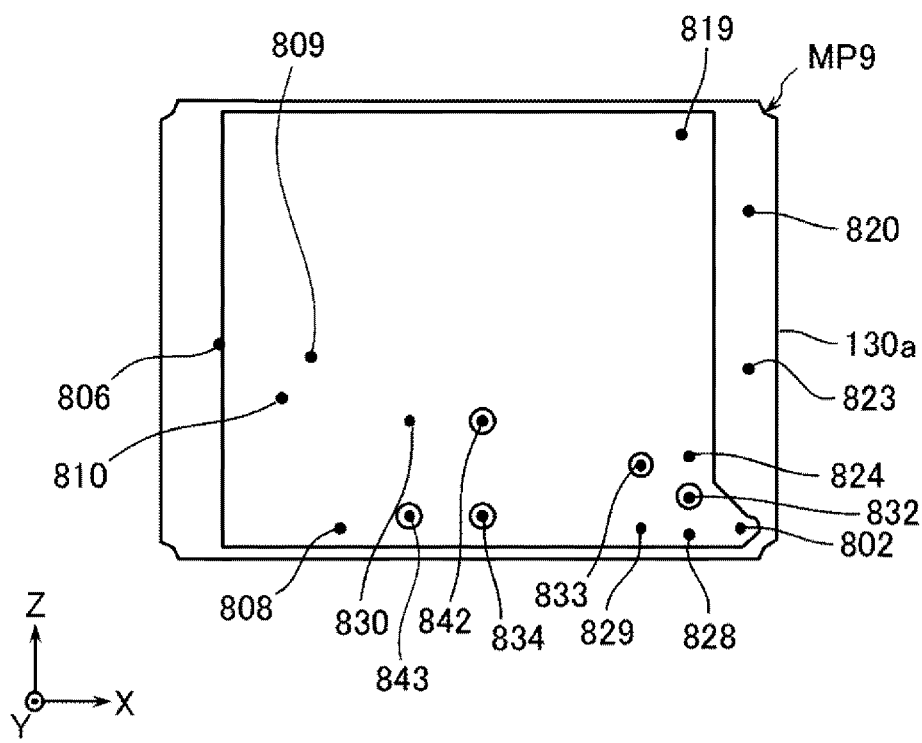
FIG. 14 is a plan view showing a ninth surface of the first container.
Figure 15:
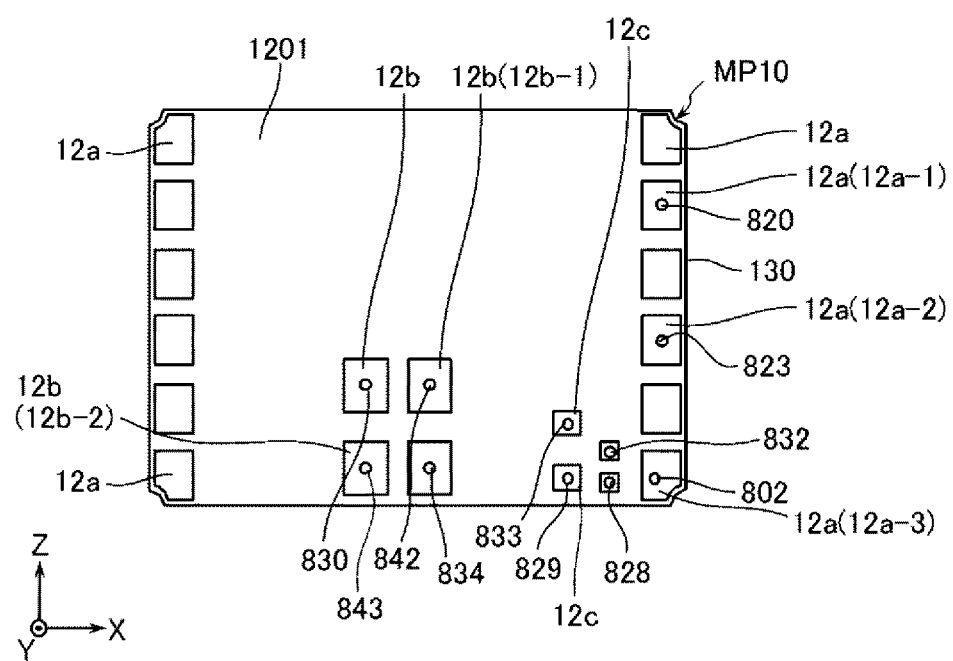
FIG. 15 is a plan view showing a tenth surface of the first container.

FIG. 6 through FIG. 15 are plan views respectively showing the first surface MP1 through the tenth surface MP10 of the first container 12. It should be noted that FIG. 6 through FIG. 14 are plan views when viewing the respective surfaces from above, and FIG. 15 is only a plan view when viewed through from above.

Figure 6:
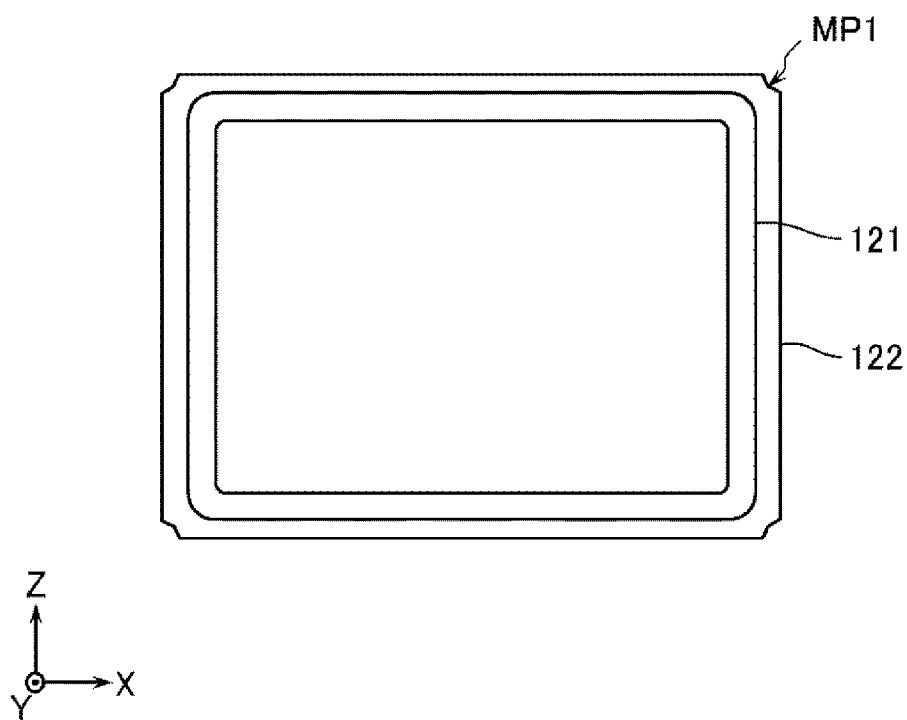
FIG. 6 is a plan view showing a first surface of a first container.

On the first surface MP1 shown in FIG. 6, there are located the first layer 121 including the seal ring and the bonding member for bonding the seal ring, and a second layer 122 functioning as a foundation of the first layer 121. It is preferable for each of the first layer 121 and the second layer 122 to be formed of a material having electrical conductivity.

Figure 7:
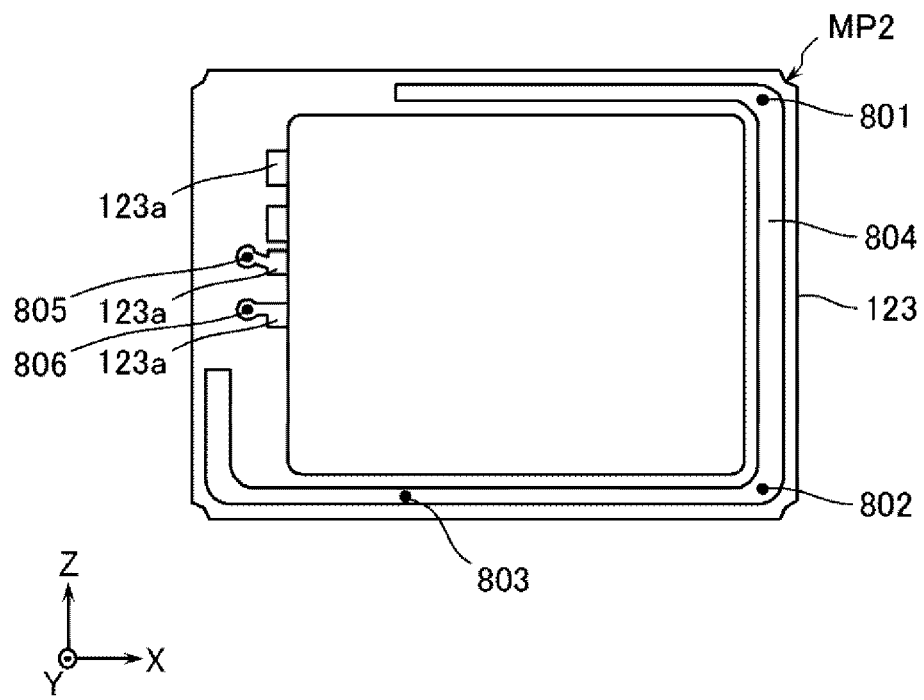
FIG. 7 is a plan view showing a second surface of the first container.

On the second surface MP2 shown in FIG. 7, there are located three via interconnections 801, 802, and 803 extending downward from the second layer 122 shown in FIG. 6, a wiring pattern 804 for electrically coupling the via interconnections 801, 802, and 803 to each other, and the electrode pads 123a. Further, there are disposed via interconnections 805, 806 extending downward from the electrode pads 123a, respectively.

It should be noted that when the second layer 122 and the first layer 121 each have electrical conductivity, the via interconnections 801, 802, and 803 are electrically coupled to each other also via these layers.

Figure 8:
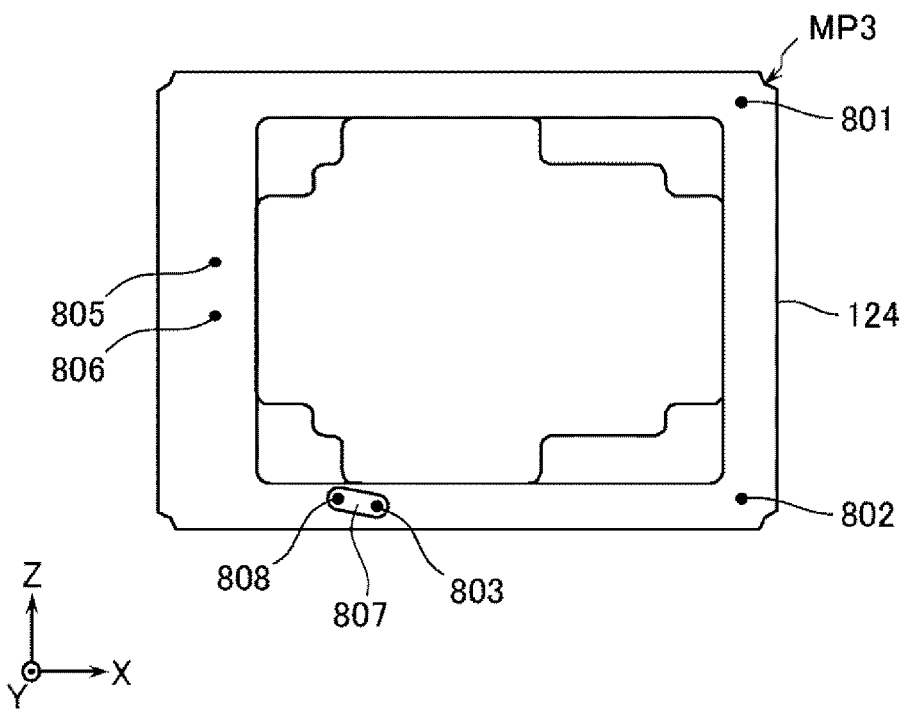
FIG. 8 is a plan view showing a third surface of the first container.

On the third surface MP3 shown in FIG. 8, there are located the via interconnections 801, 802, 803, 805, and 806 described above. Further, there are disposed a wiring pattern 807 electrically coupled to the via interconnection 803, and a via interconnection 808 extending downward from the wiring pattern 807.

Figure 9:
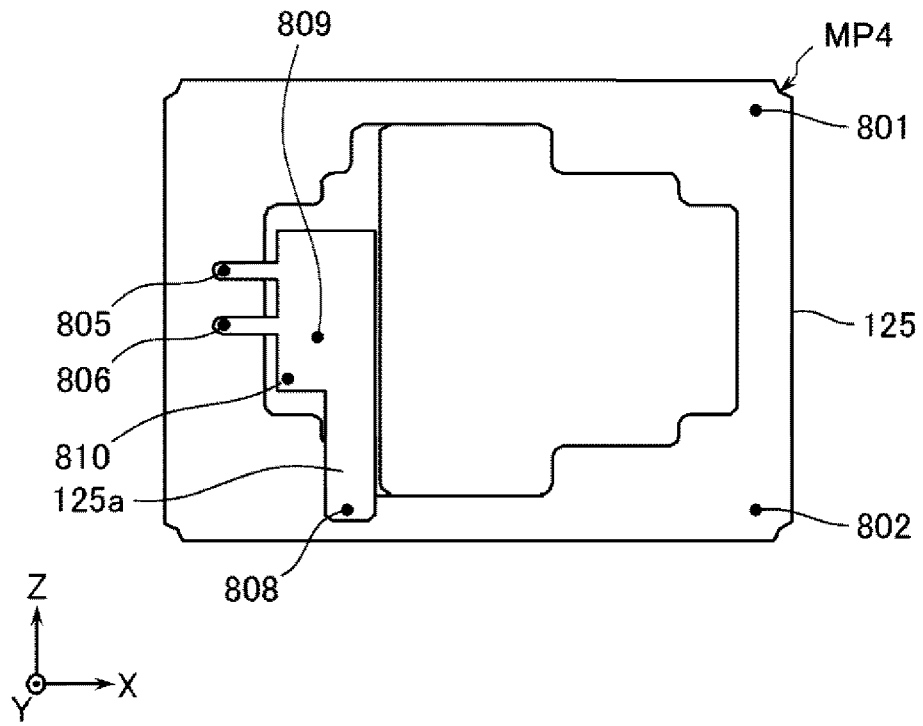
FIG. 9 is a plan view showing a fourth surface of the first container.

On the fourth surface MP4 shown in FIG. 9, there are located the via interconnections 801, 802, 805, 806, and 808 described above. Further, there is disposed a ground pattern 125a (a second ground pattern) electrically coupled to the via interconnections 805, 806, and 808. The ground pattern 125a is disposed immediately below the temperature control element described above. Further, there are disposed via interconnections 809, 810 extending downward from the ground pattern 125a.

Figure 10:
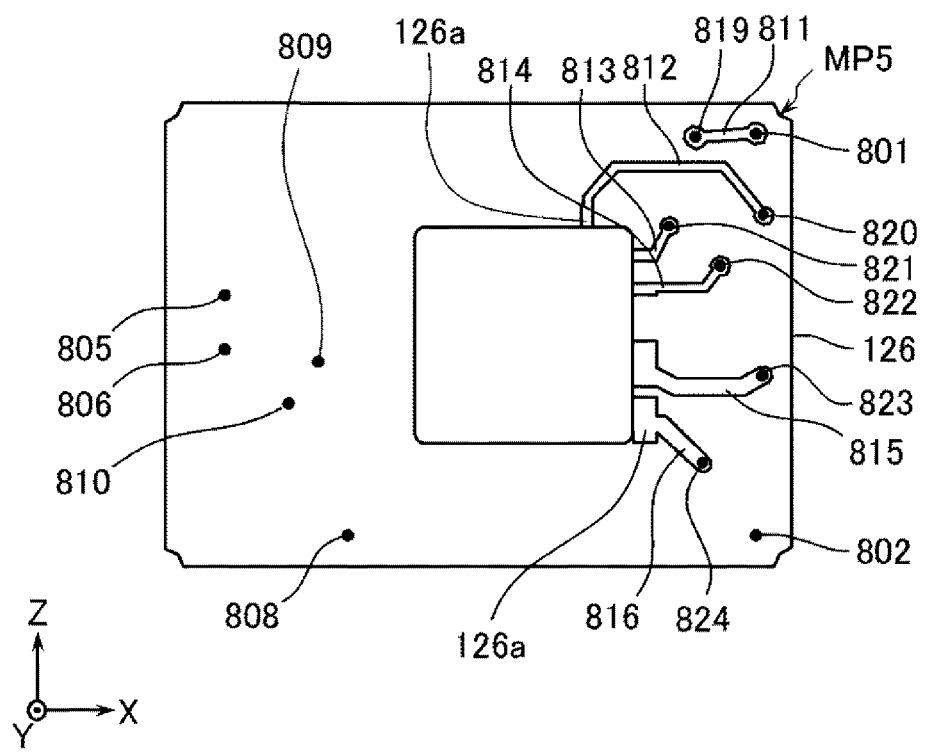
FIG. 10 is a plan view showing a fifth surface of the first container.

On the fifth surface MP5 shown in FIG. 10, there are located the via interconnections 801, 802, 805, 806, 808, 809, and 810 described above. Further, there is disposed a wiring pattern 811 electrically coupled to the via interconnection 801. Further, there are disposed wiring patterns 812, 813, 814, 815, and 816. Further, there are disposed a via interconnection 819 extending downward from the wiring pattern 811, a via interconnection 820 extending downward from the wiring pattern 812, a via interconnection 821 extending downward from the wiring pattern 813, a via interconnection 822 extending downward from the wiring pattern 814, a via interconnection 823 extending downward from the wiring pattern 815, and a via interconnection 824 extending downward from the wiring pattern 816. Further, an end part of each of the wiring patterns 812, 813, 814, 815, and 816 forms the electrode pad 126a.

Figure 11:
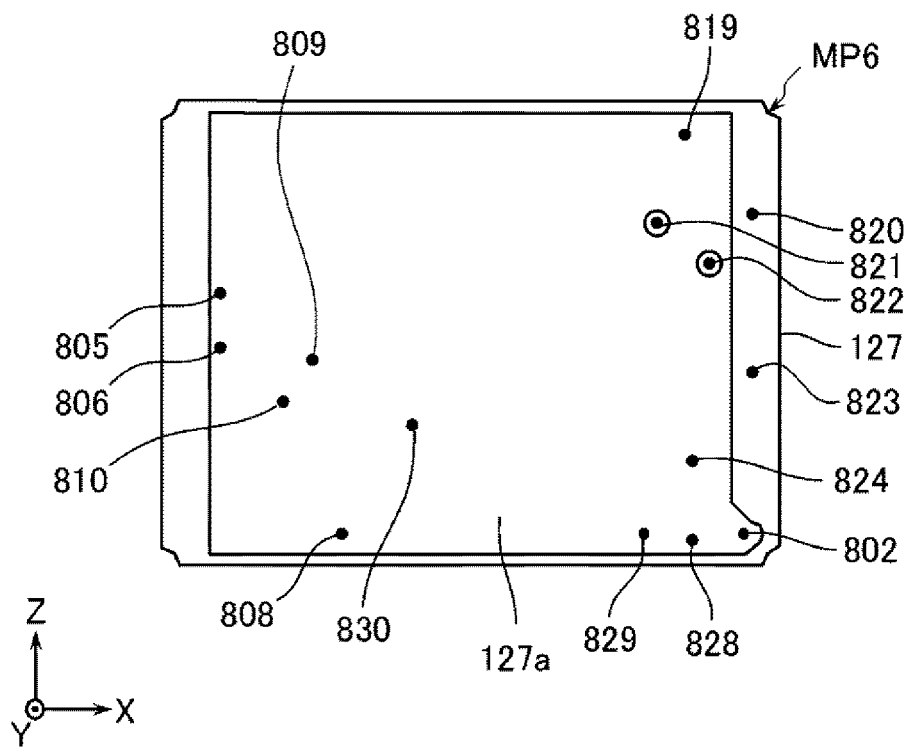
FIG. 11 is a plan view showing a sixth surface of the first container.

On the sixth surface MP6 shown in FIG. 11, there are located the via interconnections 802, 805, 806, 808, 809, 810, 819, 820, 821, 822, 823, and 824 described above. Further, there is disposed a ground pattern 127a (a first ground pattern) electrically coupled to the via interconnections 802, 805, 806, 808, 819, and 824. The ground pattern 127a is disposed immediately below the integrated circuit 14 described above. Further, there are disposed via interconnections 828, 829, and 830 extending downward from the ground pattern 127a.

Figure 12:
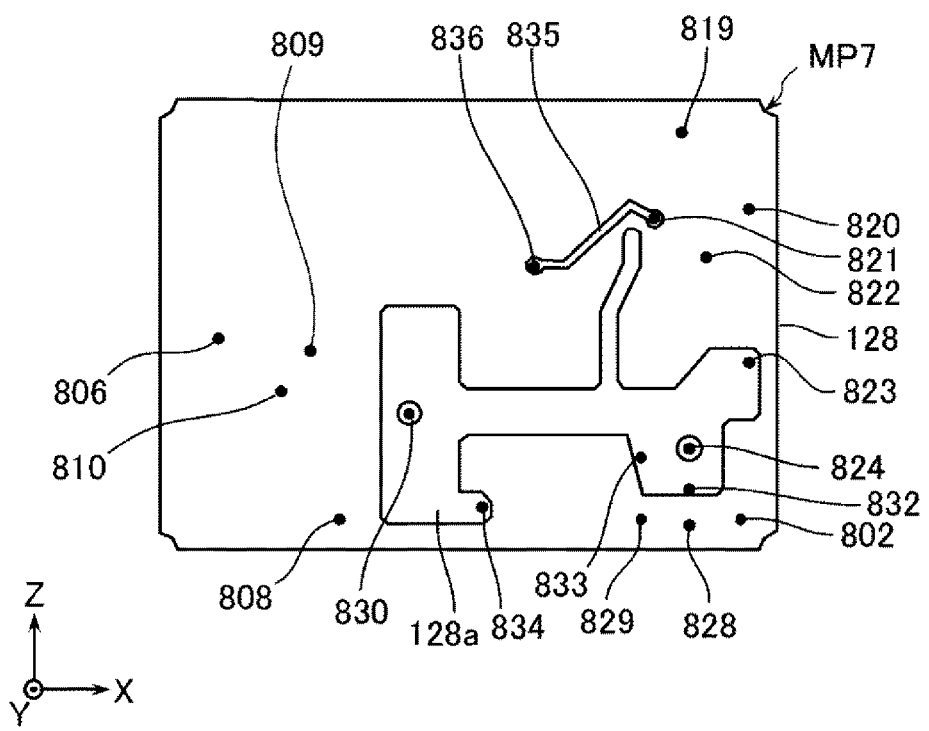
FIG. 12 is a plan view showing a seventh surface of the first container.

On the seventh surface MP7 shown in FIG. 12, there are located the via interconnections 802, 806, 808, 809, 810, 819, 820, 821, 822, 823, 824, 828, 829, and 830 described above. Further, there is disposed a power supply pattern 128a electrically coupled to the via interconnection 823. Further, there are disposed via interconnections 832, 823, and 834 extending downward from the power supply pattern 128a. Further, there is disposed a wiring pattern 835 electrically coupled to the via interconnection 821. Further, there are disposed a via interconnections 836 extending downward from the wiring pattern 835.

On the eighth surface MP8 shown in FIG. 13, there are located the via interconnections 802, 806, 808, 809, 810, 820, 822, 823, 824, 828, 829, 830, 832, 833, 834, and 836. Further, there are disposed a wiring pattern 840 electrically coupled to the via interconnection 822, and a wiring pattern 841 electrically coupled to the via interconnection 836. Further, there are disposed a via interconnection 842 extending downward from the wiring pattern 840, and a via interconnection 842 extending downward from the wiring pattern 841.

On the ninth surface MP9 shown in FIG. 14, there are located the via interconnections 802, 806, 808, 809, 810, 820, 823, 824, 828, 829, 830, 832, 833, 834, 842, and 843. Further, there is disposed a ground pattern 130a (a third ground pattern) electrically coupled to the via interconnections 802, 806, 808, 809, 810, 824, 828, 829, and 830.

On the tenth surface MP10 shown in FIG. 15, there are disposed the plurality of mounting terminals 12a, the plurality of connection terminals 12b, and the plurality of connection terminals 12c. Further, the via interconnections 802, 820, and 823 are electrically coupled respectively to the individual mounting terminals 12a. Further, the via interconnections 830, 834, 842, and 843 are electrically coupled respectively to the individual connection terminals 12b. Further, the via interconnections 828, 829, 832, and 833 are electrically coupled respectively to the individual connection terminals 12c.

It should be noted that among the mounting terminals 12a, the terminal to which the via interconnection 820 is coupled corresponds to an □output terminal 12a-1, □ the terminal to which the via interconnection 823 is coupled corresponds to a □power supply terminal 12a-2,□ and the terminal to which the via interconnection 802 is coupled corresponds to a □ground terminal 12a-3.□

As described hereinabove, inside the first container 12, there is laid a plurality of interconnections.

Figure 16:
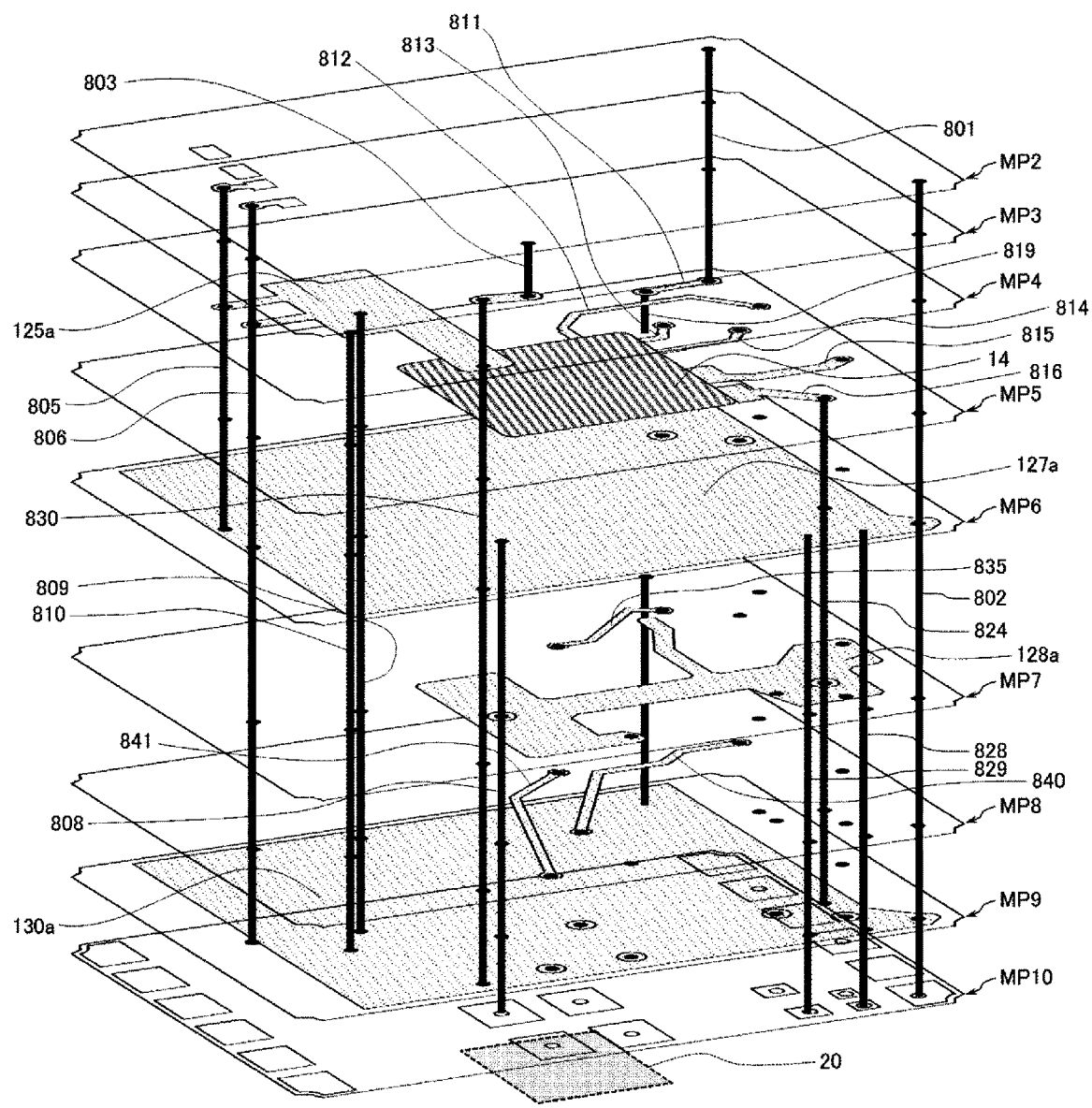
FIG. 16 is a perspective view when viewing the surfaces shown in FIG. 6 through FIG. 15 overlapping each other.

FIG. 16 is a perspective view when viewing the surfaces shown in FIG. 6 through FIG. 15 overlapping each other. It should be noted that in FIG. 16, some of the via interconnections electrically coupled to the ground terminal 12a-3 are represented by heavy lines for the sake of convenience of explanation. Further, in FIG. 16, the surfaces are illustrated in a see-through manner, and the interplanar distances are different from the interplanar distances shown in FIG. 4 for the sake of convenience of explanation.

In the oscillator 1 according to the present embodiment, since the OCXO is used as the first oscillation section 10, the temperature control element 16 is housed in the first container 12 (the first package).

On this occasion, as shown in FIG. 16, the first container 12 has the ground pattern 127a (the first ground pattern) electrically coupled to the integrated circuit 14 as the first circuit element, the ground pattern 125a (the second ground pattern) electrically coupled to the temperature control element 16, and the via interconnections 805, 806, and 824 (first via interconnections) for electrically coupling the ground pattern 127a and the ground pattern 125a to each other.

Specifically, the integrated circuit 14 is coupled to the ground pattern 127a via the wiring pattern 816 and the via interconnection 824. On the other hand, the temperature control element 16 is coupled to the ground pattern 127a via the via interconnections 805, 806.

According to such a structure, since the electrical connection of the integrated circuit 14 and the temperature control element 16 to the ground pattern 127a is achieved via the via interconnections 805, 806, and 824 each extending in the thickness direction of the first container 12, the length of the interconnections is shortened, and it is possible to suppress the impedance generated to a lower level. Thus, it is possible to suppress, for example, the error of the temperature control in the temperature control element 16 to a lower level, and thus, it is possible to prevent the deterioration of the frequency-temperature characteristic of the oscillator 1.

Further, as shown in FIG. 16, the first container 12 has the ground pattern 130a as the third ground pattern. The ground pattern 130a overlaps the ground pattern 127a (the first ground pattern) and the ground pattern 125a (the second ground pattern) in a plan view. Further, the ground pattern 130a is electrically coupled to the ground pattern 127a and the ground pattern 125a.

According to such a structure, the first container 12 is provided with three ground patterns relatively large in area as a result. Therefore, by disposing the ground pattern 125*a* immediately below the temperature control element 16 in such a manner as described above, it is possible to provide a shielding effect of preventing the noise generated from the temperature control element 16 from interfering with the integrated circuit 14. Further, by disposing the ground pattern 127*a* immediately below the integrated circuit 14, it is possible to prevent the mutual interference of the noises between the integrated circuit 14 and the second oscillation section 20 from occurring. Thus, in the first oscillation section 10 and the second oscillation section 20, it is possible to prevent an abnormal oscillation from occurring, or from running into oscillation shutdown.

Further, in particular, the ground pattern 127*a* and the ground pattern 130*a* are disposed in a range constituting a large portion of the first container 12 in a plan view. As an example, the range constitutes 70% or more of the area of the first container 12 in the plan view. By disposing such ground patterns 127*a*, 130*a*, it becomes difficult for the noise generated from the integrated circuit 14 or the second oscillation section 20 to interfere with the interconnections disposed between the ground patterns 127*a*, 130*a*. Therefore, as shown in FIG. 16, by disposing the ground pattern 127*a* immediately below the integrated circuit 14 and disposing the ground pattern 130*a* immediately above the second oscillation section 20, it is possible to provide a sufficient thickness between the ground pattern 127*a* and the ground pattern 130*a* to thereby make a number of layers intervene therebetween. As a result, it is possible to dispose a number of interconnections therebetween, and to provide a more superior shielding effect to those interconnections.

For example, since the wiring pattern 840 shown in FIG. 13 and FIG. 16 is sandwiched between the ground pattern 127*a* and the ground pattern 130*a* as a result, it is possible to prevent the noise from being externally superimposed on the frequency signal passing therethrough to thereby make the frequency fluctuation difficult to occur.

Although the oscillator 1 according to the present embodiment is provided with the lid member 19 (the first lid body) shown in FIG. 4, the ground pattern 127*a* (the first ground pattern) and the ground pattern 125*a* (the second ground pattern) are electrically coupled to the lid member 19 via the plurality of via interconnections 801, 802, 803, 808, and 819 (second via interconnections).

Specifically, the lid member 19 is electrically coupled to the via interconnections 801, 802, and 803 via the first layer 121 and the second layer 122 having electrical conductivity shown in FIG. 4. Further, as shown in FIG. 16, the via interconnection 802 is directly coupled to the ground pattern 127*a* and the ground pattern 125*a*, the via interconnection 801 is coupled to the ground pattern 127*a* and the ground pattern 125*a* via the via interconnection 819 and so on, and the via interconnection 803 is coupled to the ground pattern 127*a* and the ground pattern 125*a* via the via interconnection 830 and so on.

According to such a structure, since the lid member 19 can be provided with the ground potential, it is possible to use the lid member 19 as a ground pattern. Thus, since the whole of the inside of the first container 12 can be covered with the ground potential, it is possible to provide a more excellent shielding effect.

Figure 17:
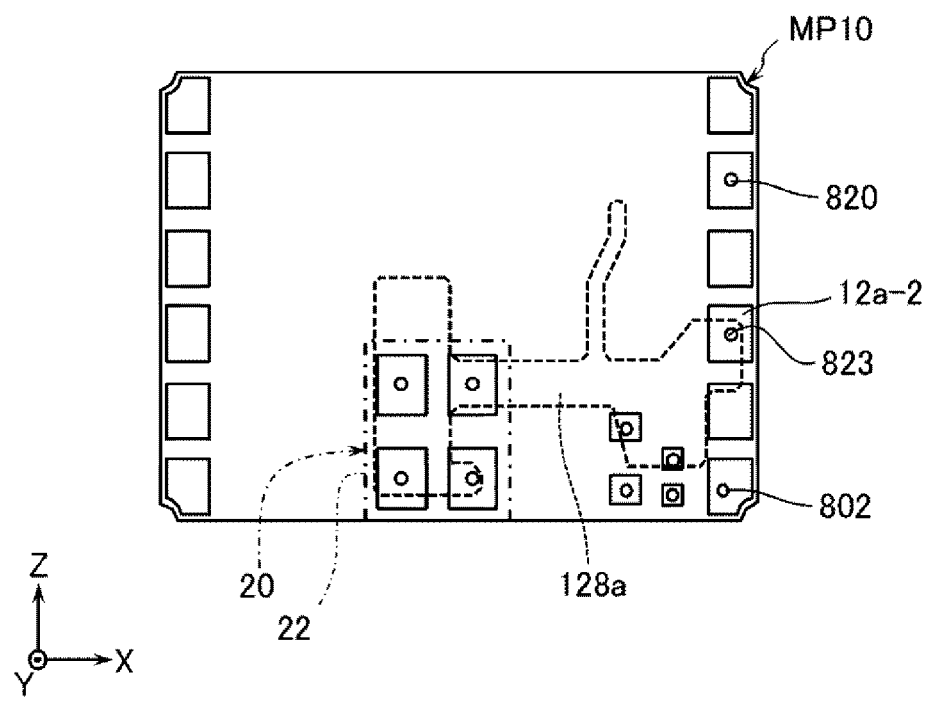
FIG. 17 is a diagram showing the power supply pattern disposed on the seventh surface shown in FIG. 12 projected on the tenth surface shown in FIG. 15.

FIG. 17 is a diagram showing the power supply pattern 128*a* disposed on the seventh surface MP7 shown in FIG. 12 projected on the tenth surface MP10 shown in FIG. 15. Further, in addition, in FIG. 17, the second container 22 of the second oscillation section 20 is also projected. It should be noted that in FIG. 17, the outline of the power supply pattern 128*a* is represented by the dotted line, and the outline of the second container 22 is represented by the dashed-dotted line.

As shown in FIG. 17, the power supply pattern 128*a* provided to the first container 12 overlaps the second container 22 in the plan view. Since the power supply pattern 128*a* is coupled to the power supply terminal 12*a*-2 via the via interconnection 823 as described above, a direct-current potential is applied to the power supply pattern 128*a*.

According to such a structure, the power supply pattern 128*a* functions as a shielding pattern. Thus, it is possible to block or attenuate the noise generated from the second oscillation section 20 with the power supply pattern 128*a*, and thus, it is possible to prevent the noise from interfering with the integrated circuit 14 and so on. Further, by contraries, it is possible to prevent the noise generated from the integrated circuit 14 from interfering with the second oscillation section 20.

It should be noted that although it is sufficient for the power supply pattern 128*a* to overlap at least a part of the second container 22 in the plan view, the area ratio of the overlapping part is preferably no smaller than 10% of the project area of the second container 22, and is more preferably no smaller than 30% thereof. Thus, a sufficient shielding effect can be obtained.

It should be noted that the size in the plan view of the second container 22 is not particularly limited, but is smaller than the mounting surface 1201 in the present embodiment. In that case, the second container 22 can be mounted anywhere in the mounting surface 1201, but is preferably located at a position where the whole of the second container 22 does not overlap the integrated circuit 14 in the plan view. More preferably, the second container 22 is located at a position where a part of the second container 22 overlaps the integrated circuit 14. Thus, it is possible to make the length of the interconnections shorter while preventing the noise generated from the integrated circuit 14 from interfering with the second oscillation section 20 as much as possible.

Further, as described above, the mounting terminals 12*a* of the first container 12 include the output terminal 12*a*-1.

Further, on the upper surface of the second container 22, there is disposed the plurality of mounting terminals 22*a* as described above. Among the connection terminals 12*b* respectively bonded to these mounting terminals, the terminal to which the via interconnection 842 is coupled corresponds to an □oscillation output terminal 12*b*-1,□ the terminal to which the via interconnection 843 is coupled corresponds to a □frequency control terminal 12*b*-2□ as shown in FIG. 15. In other words, the second container 22 has the mounting terminal 22*a* to be bonded to the oscillation output terminal 12*b*-1 for outputting the frequency signal (the second oscillation signal) to be generated by oscillating the quartz crystal resonator element 28 (the second resonator element), and the mounting terminal 22*a* to be bonded to the frequency control terminal 12*b*-2 to which the direct-current signal (the frequency control signal) for controlling the frequency of the frequency signal output from the oscillation output terminal 12*b*-1 is input.

Further, as shown in FIG. 10, the first container has the wiring pattern 814 (an oscillation output interconnection) electrically coupled to the oscillation output terminal 12*b*-1 to be bonded to the mounting terminal 22*a* of the second container 22, the wiring pattern 812 (an output interconnection) electrically coupled to the output terminal 12*a*-1 of the first container 12, and the wiring pattern 813 (a frequency control interconnection) electrically coupled to the frequency control terminal 12b-2 to be bonded to the mounting terminal 22a of the second container 22.

According to such a structure, since the wiring pattern 813 to which the direct-current signal is input is sandwiched between the wiring pattern 814 and the wiring pattern 812 each for transmitting the frequency signal, the wiring pattern 813 functions as a shield pattern for blocking or attenuating the noise between the wiring pattern 814 and the wiring pattern 812. Thus, it is possible to prevent the noises from mutually interfering with each other between the wiring pattern 814 and the wiring pattern 812 to thereby prevent occurrence of the frequency fluctuation.

Further, from the same viewpoint as above, the wiring pattern 840 and the wiring pattern 841 shown in FIG. 13 extend so as to be adjacent to each other. In other words, the wiring pattern 841 to which the direct-current signal is input is closely disposed along the wiring pattern 840 in which the frequency signal is transmitted. Thus, it is possible to make the wiring pattern 841 function as a shield pattern for the wiring pattern 840. As a result, it is possible to reduce the noise to be superimposed on the signal of the wiring the wiring pattern 840.

It should be noted that the expression that the wiring pattern 840 and the wiring pattern 841 extend so as to be adjacent to each other means that, for example, no interconnection in which an alternating-current signal is transmitted is disposed between the wiring patterns.

In the present embodiment, it is also possible for the wiring pattern 841 to be located within a range of the distance from the wiring pattern 840 of no more than 1 mm, and at the same time, for the arrangement to continuously be kept for no less than 3 mm in the longitudinal direction of the wiring pattern 840.

Figure 18:
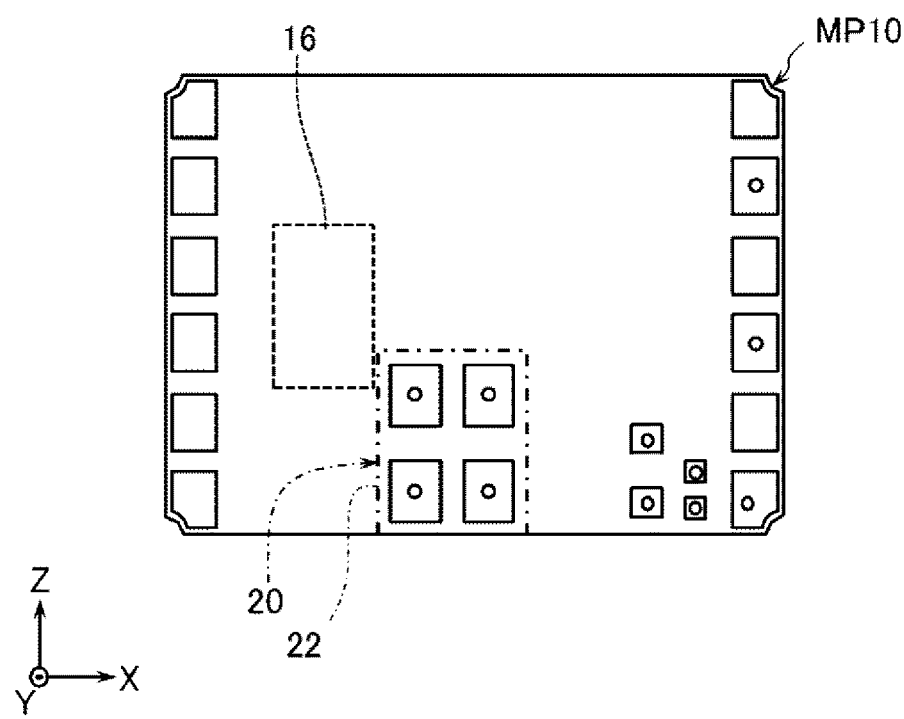
FIG. 18 is a diagram showing a temperature control element projected on the tenth surface shown in FIG. 15.

FIG. 18 is a diagram showing a temperature control element 16 projected on the tenth surface MP10 shown in FIG. 15. Further, in addition, in FIG. 18, the second container 22 of the second oscillation section 20 is also projected. It should be noted that in FIG. 18, the outline of the temperature control element 16 is represented by the dotted line, and the outline of the second container 22 is represented by the dashed-dotted line.

The temperature control element 16 and the second container 22 can partially overlap each other in the plan view, but are arranged in FIG. 18 so as not to overlap each other.

According to such a structure, the physical distance between the temperature control element 16 and the second container 22 can be ensured long. Therefore, the heat generated in the temperature control element 16 becomes difficult to be conducted to the second container 22, and it is possible to prevent the characteristics of the second oscillation section 20 from deteriorating due to the influence of the heat.

Figure 19:
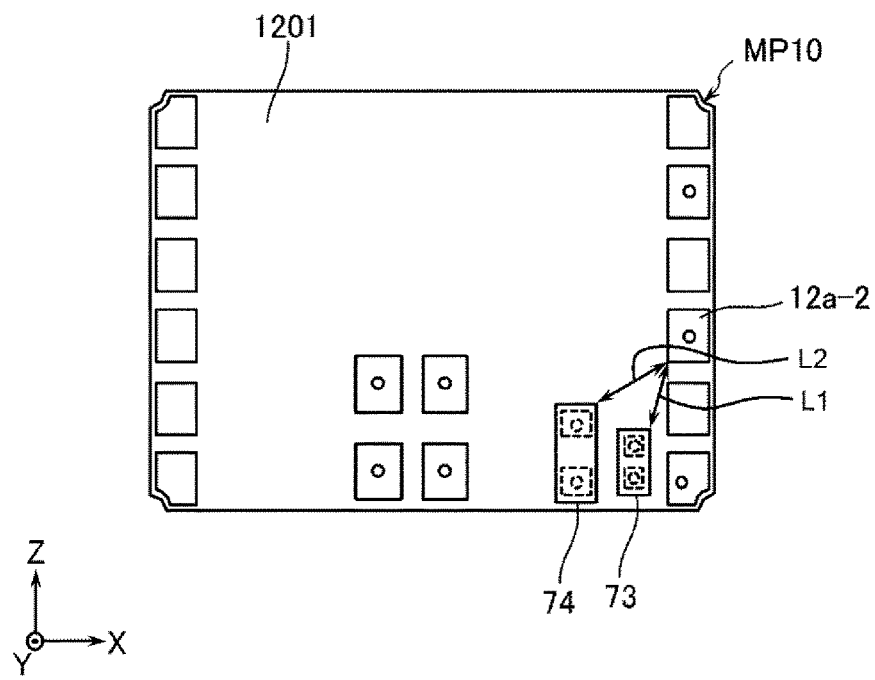
FIG. 19 is a diagram showing the state in which a first bypass capacitor and a second bypass capacitor are mounted on the tenth surface shown in FIG. 15.

FIG. 19 is a diagram showing the state in which the bypass capacitor 73 (the first bypass capacitor) and the bypass capacitor 74 (the second bypass capacitor) are mounted on the tenth surface MP10 shown in FIG. 15. In the present embodiment, the tenth surface MP10 forms a component mounting surface. In other words, both of the mounting surface 1201 and the component mounting surface correspond to the tenth surface MP10. It should be noted that the component mounting surface is not limited to this position.

Further, the first container 12 has the component mounting surface, the power supply terminal 12a-2 which is disposed on the component mounting surface, and to which the power supply voltage, namely the direct-current potential, is applied, and the bypass capacitor 73 and the bypass capacitor 74 mounted of the component mounting surface.

Among these constituents, the withstand voltage value of the bypass capacitor 73 can be lower than the withstand voltage value of the bypass capacitor 74, but is preferably higher. Further, the distance between the bypass capacitor 73 and the power supply terminal 12a-2 can be larger than the distance between the bypass capacitor 74 and the power supply terminal 12a-2, but is made smaller in FIG. 19.

According to such an oscillator 1, it is possible to absorb the noise to be superimposed on the power supply voltage to thereby reduce the noise with the two bypass capacitors, namely the first bypass capacitors 73, 74. Further, by disposing the bypass capacitor 73 higher in withstand voltage value, namely the highest bearable voltage value, closer to the power supply terminal 12a-2 than the bypass capacitor 74 lower in the withstand voltage value, it is possible to make the bypass capacitor 73 preferentially absorb the noise with an excessive voltage to be superimposed on the power supply voltage. Thus, it is possible to reduce the excessive voltage using the relatively high withstand voltage value of the bypass capacitor 73 to prevent the breakdown of the bypass capacitor 74. As a result, it is possible to make both of the bypass capacitors 73, 74 function soundly and effectively.

In contrast, unlike the above, it is also possible to make the capacitance value of the bypass capacitor 73 smaller than the capacitance value of the bypass capacitor 74. Further, also in this case, the distance between the bypass capacitor 73 and the power supply terminal 12a-2 is made smaller than the distance between the bypass capacitor 74 and the power supply terminal 12a-2 in FIG. 19.

According to such an oscillator 1, by using the two bypass capacitors 73, 74 different in capacitance value from each other, it is possible to absorb the noise to be superimposed on the power supply voltage in a broader frequency range.

Further, when the capacitance value is small, in general, it is often the case that the withstand voltage value is higher than that of a capacitor larger in capacitance value. Therefore, by disposing the bypass capacitor 73 smaller in capacitance value closer to the power supply terminal 12a-2 than the bypass capacitor 74 larger in the capacitance value, it is possible to make the bypass capacitor 73 preferentially absorb the noise with an excessive voltage to be superimposed on the power supply voltage. Thus, it is possible to reduce the excessive voltage using the relatively high withstand voltage value of the bypass capacitor 73 to prevent the breakdown of the bypass capacitor 74. As a result, it is possible to make both of the bypass capacitors 73, 74 function soundly and effectively.

Modified Example

Then, an oscillator according to a modified example will be described.

Figure 20:
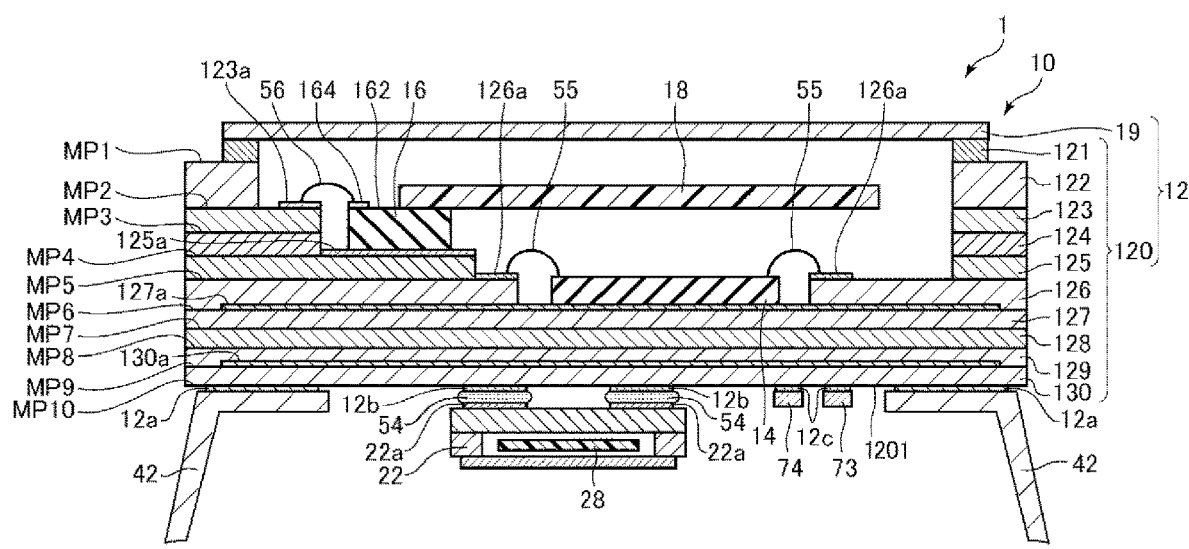
FIG. 20 is a cross-sectional view showing a structure of an oscillator according to a modified example.
Figure 21:
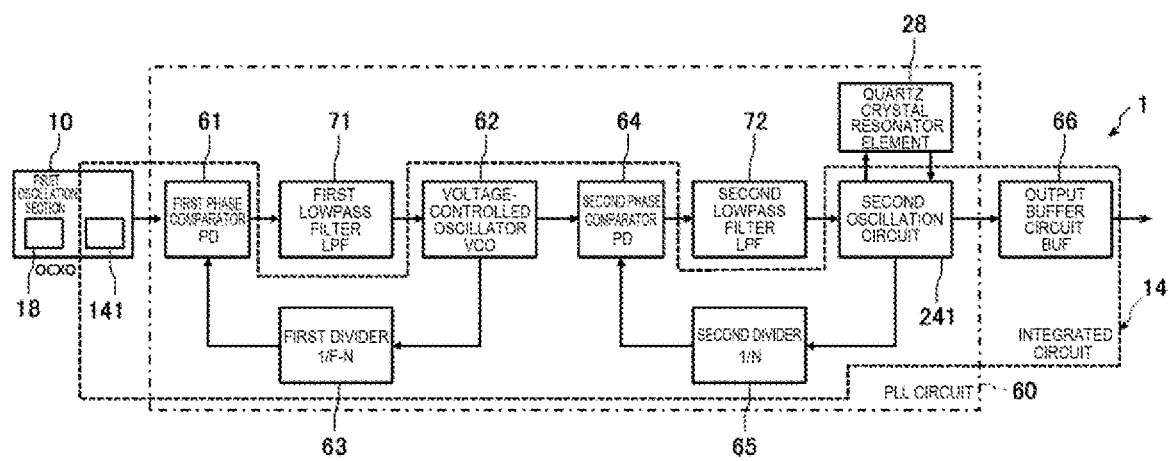
FIG. 21 is a block diagram showing a circuit configuration of the oscillator according to the modified example.

FIG. 20 is a cross-sectional view showing a structure of the oscillator according to the modified example. FIG. 21 is a block diagram showing the circuit configuration of the oscillator according to the modified example. It should be noted that in the following description, the description will be presented focusing mainly on differences from the embodiment described above, and the description of substantially the same matters will be omitted. Further, in FIG. 20 and FIG. 21, the constituents substantially identical to those of the embodiment described above are denoted by the same reference symbols.

The second oscillation section 20 is the VCXO in the embodiment described above, while in the present modified example, the function of the integrated circuit 24 included in the VCXO is incorporated in the integrated circuit 14. Specifically, in the present modified example, the second oscillation section 20 according to the embodiment described above is divided into the second container 22 housing the quartz crystal resonator element 28, and the integrated circuit 24, and the circuit configuration of the integrated circuit 24, namely the second oscillation circuit 241, is installed in the integrated circuit 14 in a mixed manner.

In this case, on the lower surface of the first container 12, namely the mounting surface 1201, there is disposed the second container 22 housing the quartz crystal resonator element 28 instead of the second oscillation section 20 as shown in FIG. 20. Therefore, it is possible to achieve low-profiling of the second container 22. As a result, low-profiling and reduction in size of the oscillator 1 can be achieved.

Further, as shown in FIG. 21, the second oscillation circuit 241 which has been included in the integrated circuit in the embodiment described above is included in the integrated circuit 14 in addition to substantially the same constituents as in the embodiment described above as a result.

According to such a modified example as described above, substantially the same advantages as in the embodiment described above can be obtained.

Electronic Apparatus

Figure 22:
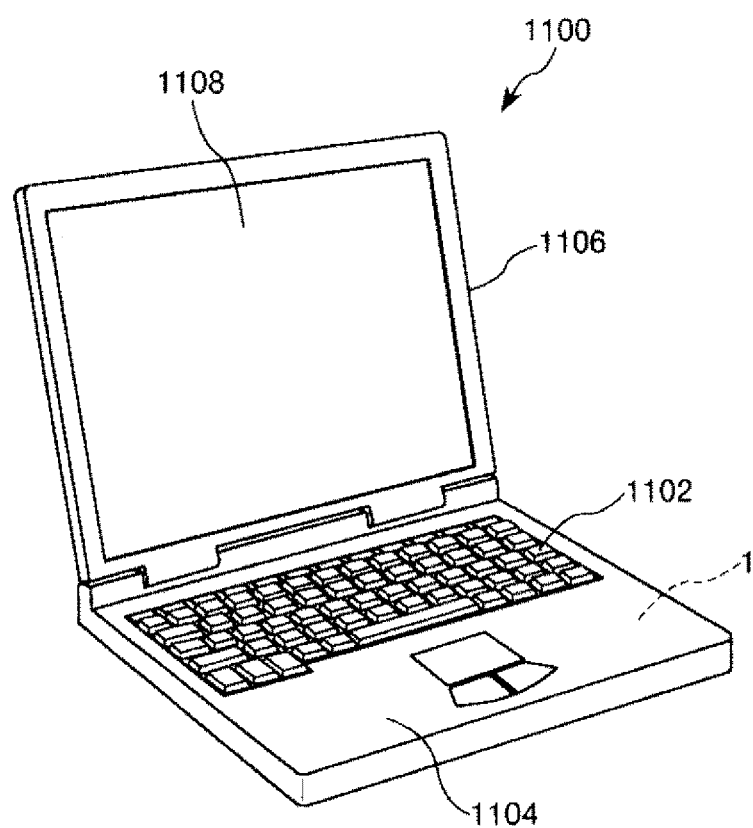
FIG. 22 is a perspective view showing a mobile type personal computer as an electronic apparatus according to an embodiment.

FIG. 22 is a perspective view showing a mobile type personal computer as an electronic apparatus according to an embodiment.

In FIG. 22, the personal computer 1100 includes a main body 1104 provided with a keyboard 1102, and a display unit 1106 provided with a display 1108, and the display unit 1106 is pivotally supported with respect to the main body 1104 via a hinge structure. Such a personal computer 1100 incorporates the oscillator 1 for generating the reference clock signal and so on.

Figure 23:
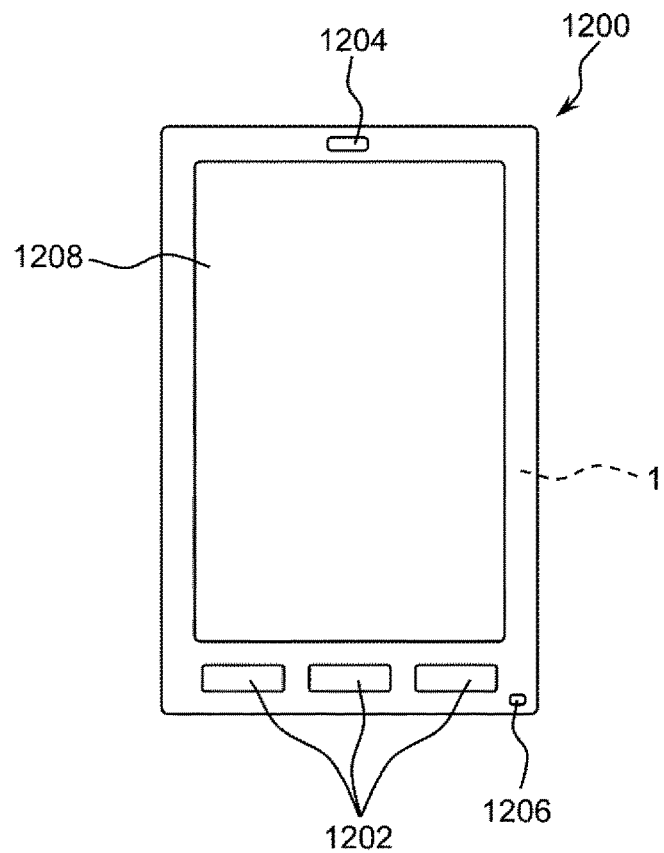
FIG. 23 is a plan view showing a cellular phone as an electronic apparatus according to an embodiment.

FIG. 23 is a plan view showing a cellular phone as an electronic apparatus according to an embodiment.

In FIG. 23, the cellular phone 1200 is provided with an antenna not shown, a plurality of operation buttons 1202, an ear piece 1204, and a mouthpiece 1206, and a display 1208 is disposed between the operation buttons 1202 and the earpiece 1204. Such a cellular phone 1200 incorporates the oscillator 1 for generating the reference clock signal and so on.

Figure 24:
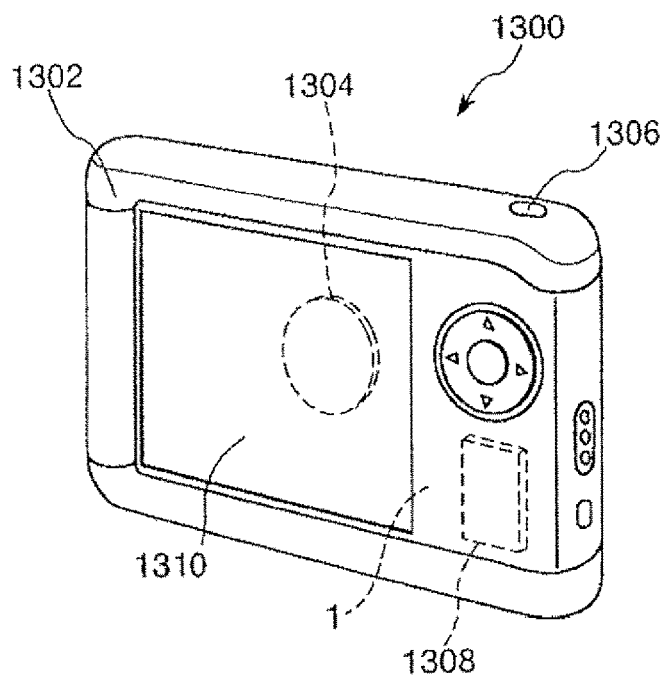
FIG. 24 is a perspective view showing a digital still camera as an electronic apparatus according to an embodiment.

FIG. 24 is a perspective view showing a digital still camera as an electronic apparatus according to an embodiment.

In FIG. 24, the case 1302 of the digital still camera 1300 is provided with a display 1310 disposed on the back surface thereof to have a configuration of performing display in accordance with the imaging signal from the CCD, wherein the display 1310 functions as a viewfinder for displaying the object as an electronic image. Further, the case 1302 is provided with a light receiving unit 1304 including an imaging optical system such as an optical lens, the CCD, and so on disposed on the front side, namely the back side in the drawing, of the case 1302. Then, when the photographer checks an object image displayed on the display 1310, and then presses a shutter button 1306, the imaging signal from the CCD at that moment is transferred to and stored in a memory 1308. Such a digital still camera 1300 incorporates the oscillator 1 for generating the reference clock signal and so on.

Such electronic apparatuses as described hereinabove are each provided with the oscillator 1. According to such electronic apparatuses as described above, it is possible to improve the characteristics of the electronic apparatuses using the high-accuracy reference clock signal generated by the oscillator 1.

It should be noted that, the electronic apparatus equipped with the oscillator 1 can also be, for example, a smartphone, a tablet terminal, a timepiece including a smart watch, an inkjet ejection device such as an inkjet printer, a wearable terminal such as a head-mounted display (HMD), a laptop personal computer, a television set, a video camera, a video cassette recorder, a car navigation system, a pager, a personal digital assistance including one with a communication function, an electronic dictionary, an electronic calculator, a computerized game machine, a word processor, a workstation, a video phone, a security video monitor, a pair of electronic binoculars, a POS terminal, medical equipment such as an electronic thermometer, an electronic manometer, an electronic blood sugar meter, an electrocardiogram measurement instrument, an ultrasonograph, and an electronic endoscope, a fish detector, a variety of types of measurement instruments, a variety of types of gauges such as gauges for a car, an aircraft, a ship or a boat, abase station for mobile terminals, and a flight simulator, besides the personal computer shown in FIG. 22, the mobile phone shown in FIG. 23, and the digital still camera shown in FIG. 24.

Vehicle

Figure 25:
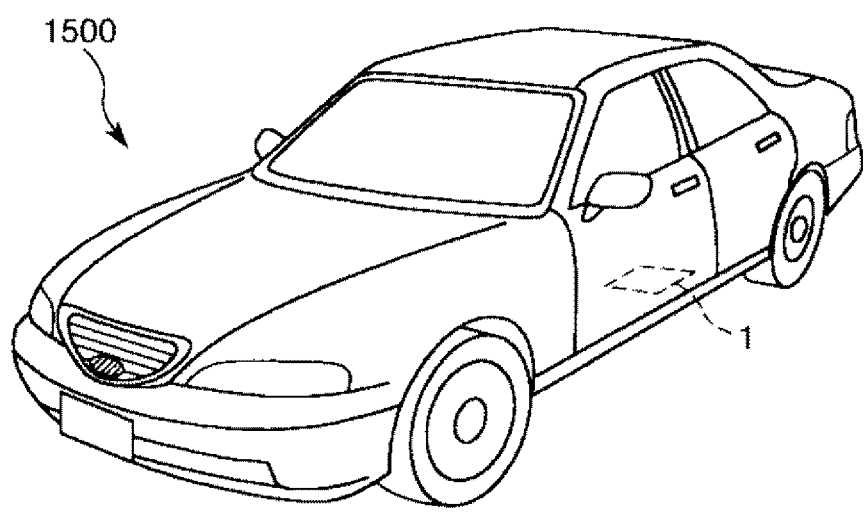
FIG. 25 is a perspective view showing a car as a vehicle according to an embodiment.

FIG. 25 is a perspective view showing a car as a vehicle according to an embodiment.

The car 1500 shown in FIG. 25 incorporates the oscillator 1 described above. The oscillator 1 can widely be applied to an electronic control unit (ECU) such as a keyless entry system, an immobilizer, a car navigation system, a car air-conditioner, an anti-lock braking system (ABS), an airbag system, a tire pressure monitoring system (TPMS), an engine controller, a braking system, a battery monitor for a hybrid car or an electric car, or a vehicle posture control system.

Such a vehicle as described hereinabove is equipped with the oscillator 1. According to such a vehicle as described above, it is possible to improve the characteristics of the vehicle using the high-accuracy reference clock signal generated by the oscillator 1.

It should be noted that the vehicle equipped with the oscillator 1 can also be, for example, a robot, a drone, a two-wheeled vehicle, an airplane, a ship, an electric train, a rocket, or a space vehicle besides the car shown in FIG. 25.

Although the oscillator, the electronic apparatus, and the vehicle according to the present disclosure are described based on the embodiments shown in the accompanying drawings, the present disclosure is not limited to these embodiments, but the configuration of each of the constituents can be replaced with those having an identical function and an arbitrary configuration. Further, it is also possible to add any other constituents to the present disclosure.

What is claimed is:
1. An oscillator comprising:
a first resonator element;
a first circuit element configured to oscillate the first resonator element to generate a first oscillation signal;

a first package that houses the first resonator element and the first circuit element, and has a mounting surface and a mounting terminal disposed on the mounting surface;

a second resonator element an oscillation frequency of which is controlled based on the first oscillation signal;

a second package that houses the second resonator element and is provided with the second package mounted on the mounting surface of the first package; and a temperature control element housed in the first package, wherein the first package has a first ground pattern electrically coupled to the first circuit element, a second ground pattern electrically coupled to the temperature control element, and a first via interconnection configured to electrically couple the first ground pattern and the second ground pattern to each other, and the first package further has a third ground pattern which overlaps the first ground pattern and the second ground pattern in a plan view, and is electrically coupled to the first ground pattern and the second ground pattern.

2. An oscillator comprising:

a first resonator element;

a first circuit element configured to oscillate the first resonator element to generate a first oscillation signal;

a first package that houses the first resonator element and the first circuit element, and has a mounting surface and a mounting terminal disposed on the mounting surface;

a second resonator element an oscillation frequency of which is controlled based on the first oscillation signal;

a second package that houses the second resonator element and is provided with the second package mounted on the mounting surface of the first package; and a temperature control element housed in the first package, wherein the first package has a first ground pattern electrically coupled to the first circuit element, a second ground pattern electrically coupled to the temperature control element, and a first via interconnection configured to electrically couple the first ground pattern and the second ground pattern to each other, the first package includes a first lid body, and the first ground pattern and the second ground pattern are electrically coupled to the first lid body via a plurality of second via interconnections.

3. The oscillator according to claim 1, wherein the first package includes a shield pattern overlapping the second package in a plan view, and a direct-current potential is applied to the shield pattern.

4. An oscillator comprising:

a first resonator element;

a first circuit element configured to oscillate the first resonator element to generate a first oscillation signal;

a first package that houses the first resonator element and the first circuit element, and has a mounting surface and a mounting terminal disposed on the mounting surface;

a second resonator element an oscillation frequency of which is controlled based on the first oscillation signal;

a second package that houses the second resonator element and is provided with the second package mounted on the mounting surface of the first package;

the mounting terminal of the first package includes an output terminal configured to output an output signal, the second package includes an oscillation output terminal configured to output a second oscillation signal generated by oscillating the second resonator element, and a frequency control terminal to which a frequency control signal used to control a frequency of the second oscillation signal is input, and the first package includes an oscillation output interconnection electrically coupled to the oscillation output terminal, an output interconnection electrically coupled to the output terminal, and a frequency control interconnection disposed between the oscillation output interconnection and the output interconnection in a plan view, and electrically coupled to the frequency control terminal.

5. The oscillator according to claim 1, wherein the temperature control element and the second package do not overlap each other in a plan view.

6. The oscillator according to claim 1, further comprising:

a first bypass capacitor and a second bypass capacitor, wherein the first package includes a component mounting surface, and a power supply terminal which is disposed on the component mounting surface, and to which a power supply voltage is applied, the first bypass capacitor and the second bypass capacitor are mounted on the component mounting surface, a withstand voltage value of the first bypass capacitor is higher than a withstand voltage value of the second bypass capacitor, and a distance between the first bypass capacitor and the power supply terminal is shorter than a distance between the second bypass capacitor and the power supply terminal.

7. The oscillator according to claim 1, further comprising:

a first bypass capacitor and a second bypass capacitor; wherein the first package includes a component mounting surface, and a power supply terminal which is disposed on the component mounting surface, and to which a power supply voltage is applied, the first bypass capacitor and the second bypass capacitor are disposed on the component mounting surface, a capacitance value of the first bypass capacitor is lower than a capacitance value of the second bypass capacitor, and a distance between the first bypass capacitor and the power supply terminal is shorter than a distance between the second bypass capacitor and the power supply terminal.

8. An electronic apparatus comprising:

the oscillator according to claim 1.

9. A vehicle comprising:

the oscillator according to claim 1.

* * * * *